(12) United States Patent
Cho

(10) Patent No.: US 8,482,100 B2
(45) Date of Patent: Jul. 9, 2013

(54) RESISTOR ARRAY AND SEMICONDUCTOR DEVICE INCLUDING THE SAME

(75) Inventor: Young-Jin Cho, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/223,818

(22) Filed: Sep. 1, 2011

(65) Prior Publication Data

US 2012/0056303 A1 Mar. 8, 2012

(30) Foreign Application Priority Data

Sep. 3, 2010 (KR) .................. 10-2010-0086249

(51) Int. Cl.
*H01L 27/105* (2006.01)

(52) U.S. Cl.
USPC ............. 257/538; 257/380; 257/E21.004; 257/E27.047; 438/383

(58) Field of Classification Search
USPC ............. 257/536–538, 387–388, 412–413, 257/332, 779, E21.004, E29.325
See application file for complete search history.

(56) References Cited

U.S. PATENT DOCUMENTS

| | | | |
|---|---|---|---|
| 5,424,239 A | 6/1995 | Sweeney | |
| 2008/0048242 A1* | 2/2008 | Choi et al. | 257/315 |
| 2008/0108200 A1* | 5/2008 | Bez et al. | 438/386 |
| 2010/0295133 A1* | 11/2010 | Kim | 257/380 |

FOREIGN PATENT DOCUMENTS

| | | |
|---|---|---|
| JP | 05326848 | 12/1993 |
| JP | 2007036124 A | 2/2007 |
| KR | 20010096353 A | 11/2001 |

* cited by examiner

*Primary Examiner* — Dung A. Le
(74) *Attorney, Agent, or Firm* — Harness, Dickey & Pierce, P.L.C.

(57) ABSTRACT

A resistor array includes a semiconductor substrate, a plurality of isolation regions, a plurality of dummy active regions and a plurality of unit resistors. The plurality of isolation regions are formed in the semiconductor substrate. The plurality of dummy active regions are formed in the semiconductor substrate between the plurality of isolation regions. The plurality of unit resistors are formed on the plurality of dummy active regions.

22 Claims, 11 Drawing Sheets

RESISTOR ARRAY AND SEMICONDUCTOR DEVICE INCLUDING THE SAME

CROSS-REFERENCE TO RELATED APPLICATION(S)

This application claims priority under 35 USC §119 to Korean Patent Application No. 10-2010-0086249, filed on Sep. 3, 2010, in the Korean Intellectual Property Office (KIPO), the contents of which are incorporated herein in its entirety by reference.

BACKGROUND

1. Technical Field

Example embodiments relate generally to semiconductor devices. For example, example embodiments of the inventive concepts relate to a resistor array formed using a semiconductor substrate and a semiconductor device including the same.

2. Description of the Related Art

Resistors used in semiconductor devices may be classified into active resistors and passive resistors. The active resistors include a resistive portion formed in a semiconductor substrate. The passive resistors correspond to separate resistive structures formed on the semiconductor substrate.

The active resistors may include diffusion regions for resistive materials. Impurities with an opposite conductive type to the semiconductor substrate may be implanted into the substrate to form the diffusion regions. Generally, the passive resistors are formed on the semiconductor substrate and surrounded by insulating materials. Therefore, compared with the active resistor, the passive resistor may have less leakage current and less deviation of resistance distribution resulting from variations in the manufacturing process.

In forming an integrated circuit using a semiconductor substrate, global planarization techniques are used to achieve flatness corresponding to a depth of focus (DOF) under the circumstance of an ever-decreasing design rule.

A chemical-mechanical polishing (CMP) process, which is one conventional planarization method, is widely used to realize desired flatness. The CMP processes are classified into oxide CMP, metal CMP and polysilicon CMP according to the polishing material used. In a manufacturing process of a passive resistor, the CMP process is performed several times, and the dishing effect may occur during the CMP process. A dishing effect means that some portion of the polished plane is lowered according to the material distribution on the polishing layer.

This dishing effect may cause instability of connection between the passive resistor and metal wiring. In addition, the resistance of the passive resistor may be unpredictably varied due to the dishing effect.

SUMMARY

Some example embodiments provide a resistor array capable of preventing or reducing a dishing effect in a Chemical-Mechanical Polishing (CMP) process without an increase in the occupation area. Some example embodiments also provide a semiconductor device including the resistor array.

According to some example embodiments, a resistor array includes a semiconductor substrate, a plurality of isolation regions, a plurality of dummy active regions and a plurality of unit resistors. The plurality of isolation regions are formed in the semiconductor substrate. The plurality of dummy active regions are formed in the semiconductor substrate between the plurality of isolation regions. The plurality of unit resistors are formed on the plurality of dummy active regions.

In some embodiments, the plurality of unit resistors may completely cover the plurality of dummy active regions.

In some embodiments, the plurality of unit resistors may further cover portions of the plurality of isolation regions adjacent to the plurality of dummy active regions.

In some embodiments, the plurality of dummy active regions may be doped with N-type impurities or P-type impurities.

In some embodiments, the plurality of dummy active regions may be floating regions without a bias-voltage being applied thereto.

In some embodiments, each of the plurality of unit resistors may be formed of polysilicon and extend in a first direction, and the plurality of unit resistors may be arranged in a second direction perpendicular to the first direction.

In some embodiments, the plurality of unit resistors may be doped with N-type impurities or P-type impurities.

In some embodiments, the resistor array may further include at least one metal wire pattern and a plurality of vertical contacts. The at least one metal wire pattern may be formed on the plurality of unit resistors. The plurality of vertical contacts may electrically connect the at least one metal wire pattern with both ends of each of the plurality of unit resistors extending in the first direction.

In some embodiments, the resistor array may further include at least one dielectric layer. The at least one dielectric layer may be formed on the semiconductor substrate. The at least one dielectric layer may isolate the plurality of unit resistors from the semiconductor substrate.

In some embodiments, one dummy active region of the plurality of dummy active regions may be formed under a corresponding unit resistor of the plurality of unit resistors.

In some embodiments, at least two dummy active regions of the plurality of dummy active regions are formed under a corresponding unit resistor of the plurality of unit resistors, the at least two dummy active regions of the plurality of dummy active regions being separated from each other.

In some embodiments, an upper surface of the semiconductor substrate may be planarized by a chemical-mechanical polishing (CMP) process before the plurality of unit resistors are formed. The plurality of dummy active regions may be configured to function as an anti-polishing medium.

According to some example embodiments, a semiconductor device includes a semiconductor substrate, a plurality of isolation regions, a plurality of dummy active regions, a plurality of unit resistors and at least one transistor. The plurality of isolation regions are formed in a first region of the semiconductor substrate. The plurality of dummy active regions are formed in the first region of the semiconductor substrate between the plurality of isolation regions. The plurality of unit resistors are formed on the plurality of dummy active regions. The at least one transistor is formed on a second region of the semiconductor substrate.

In some embodiments, the semiconductor device may further include at least one metal wire pattern and a plurality of vertical contacts. The at least one metal wire pattern may be formed on the plurality of unit resistors. The plurality of vertical contacts may electrically connect the at least one metal wire pattern with both ends of each of the plurality of unit resistors extending in the first direction.

In some embodiments, the semiconductor device may further include at least one dielectric layer. The at least one dielectric layer may be formed on the semiconductor substrate. The at least one dielectric layer may isolate the plurality of unit resistors from the semiconductor substrate.

According to some example embodiments, a resistor array includes a semiconductor substrate, a plurality of anti-polishing structures and a plurality of unit resistors. A plurality of anti-polishing structures is formed in a semiconductor substrate, and a plurality of unit resistors is formed to cover the plurality of anti-polishing structures.

In some embodiments, a plurality of separating structures may be formed in the semiconductor substrate, and the plurality of anti-polishing structures may be formed between the plurality of separating structures.

In some embodiments, the plurality of unit resistors further cover portions of the plurality of separating structures adjacent to the plurality of anti-polishing structures.

In some embodiments, the plurality of anti-polishing structures is a plurality of dummy active regions.

In some embodiments, an upper surface of the semiconductor substrate is planarized by a chemical-mechanical polishing (CMP) process before the plurality of unit resistors are formed, and the plurality of anti-polishing structures inhibit a dishing effect during the CMP process.

The resistor array and the semiconductor device according to example embodiments may prevent or inhibit a dishing effect in a CMP process without an increase of occupation area. Therefore, productivity of the semiconductor device may be increased, and the performance of the semiconductor device may be enhanced.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF EXAMPLE EMBODIMENTS

Figure 1:
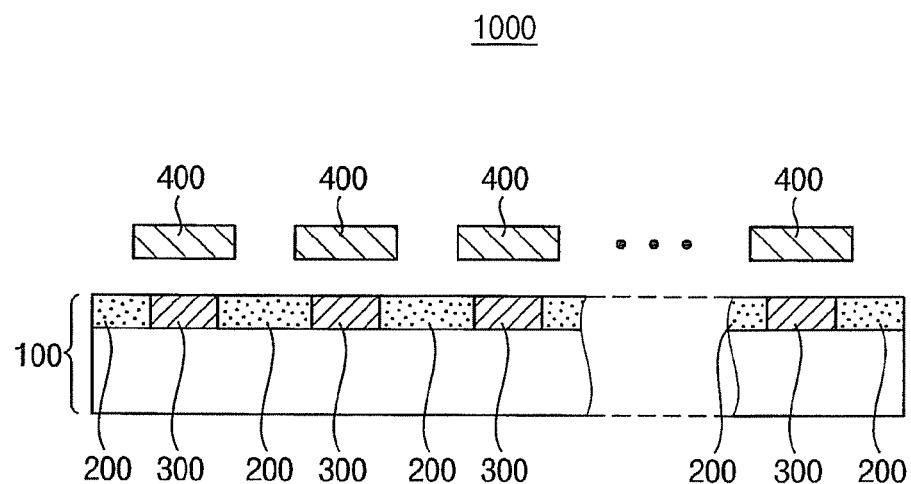
FIG. 1 is a diagram illustrating cross sectional view of a resistor array according to example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this disclosure will be thorough and complete, and will fully convey the scope of the present inventive concept to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
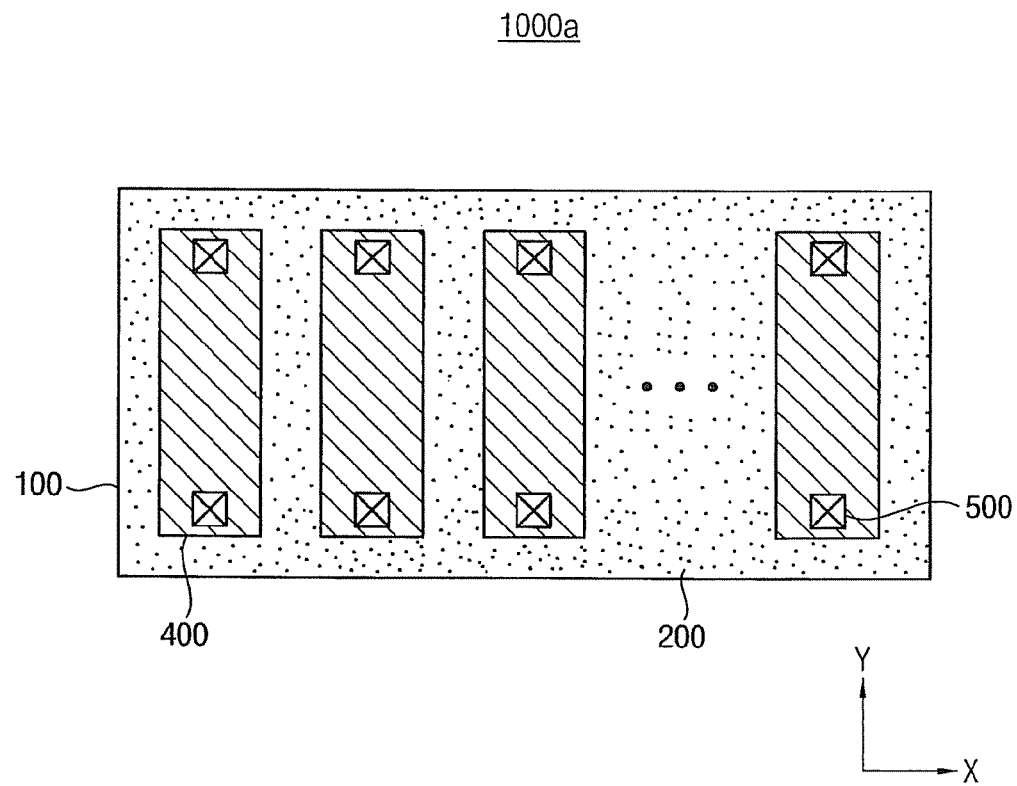
FIG. 2 is a diagram illustrating a layout of a resistor array according to example embodiments.

FIG. 1 is a cross sectional diagram illustrating a resistor array according to example embodiments. FIG. 2 is a diagram illustrating a layout of a resistor array according to example embodiments. Referring to FIG. 1, a resistor array 1000 includes a semiconductor substrate 100, a plurality of separating structures (e.g., isolation regions 200) formed in the semiconductor substrate 100, a plurality of anti-polishing structures (e.g., dummy active regions 300) formed in the semiconductor substrate 100, and a plurality of unit resistors 400 formed on the semiconductor substrate 100. The plurality of anti-polishing structures may be a plurality of dummy active regions 300 and the plurality of separating structures may be a plurality of isolation regions 200. However, example embodiments are not limited thereto.

The isolation regions 200 and the dummy active regions 300 may be directly formed in the semiconductor substrate of single crystal silicon. Alternatively, N-type well (N-well) or P-type well (P-well) may be formed in the semiconductor substrate 200 by being doped with impurities, and then the isolation regions 200 and the dummy active regions 300 may be formed in the well.

As illustrated in FIG. 1, each of the dummy active regions 300 is formed between the two adjacent isolation regions 200, and the unit resistors 400 are respectively formed on the dummy active regions 300. In this way, the plurality of unit resistors 400 may be formed on the plurality of dummy active regions 300.

In the resistor array 1000 according to example embodiments, each of the unit resistors 400 completely covers the corresponding dummy active region 300. Furthermore, the unit resistors 400 may be formed such that each of the unit resistors 400 further covers a portion of the adjacent isolation regions 200, as illustrated in FIG. 1. In other words, the width of each unit resistor 400 may be greater than or equal to the width of each dummy active region 300 located under the unit resistor 400.

The dummy active regions 300 may be doped with N-type impurities or P-type impurities. The conductive type or doping density of the impurities doped into the dummy active regions 300 may be decided considering the semiconductor substrate 100, the well previously formed in the semiconductor substrate, and the doping density of the impurities doped into the unit resistors 400.

The dummy active regions 300 may be floated without being applied by a bias-voltage. Since the unit resistors 400 completely cover the dummy active regions 300 and the dummy active regions 300 are floated, the unit resistors 400 may be less influenced by the parasitic capacitance due to the dummy active regions 300.

The unit resistors 400 may be formed of polysilicon in the same way as a gate of a transistor. Furthermore, the unit resistors 400 may be doped with N type of P type impurities. In this way, resistance of the unit resistors 400 can be controlled by doping the impurities into the unit resistors 400 of polysilicon.

As illustrated in the resistor array 1000*a* of FIG. 2, each of the unit resistors 400 may be extended in a first direction Y, and the unit resistors 400 may be arranged in a second direction X perpendicular to the first direction Y. FIG. 2 illustrates the unit resistors 400 arranged in one row. In other embodiments, the unit resistors 400 may be arranged in matrix form such that the unit resistors 400 form at least two rows.

As will be described with reference to FIGS. 11 to 14, the resistor array 1000 may further include a metal wire pattern formed on the unit resistors 400, and vertical contacts electrically connecting the unit resistors with the metal wire pattern. As illustrated in FIG. 2, the vertical contacts 500 may be formed on both ends of the unit resistors 400 extended in the first direction Y.

The unit resistors 400 may be formed on the semiconductor substrate 100 separated from the semiconductor substrate 100. For example, a dielectric layer may be formed on an upper surface of the semiconductor substrate 100, and then the unit resistors 400 may be formed on the dielectric layer.

For example, shallow-trench isolation (STI) processes may be performed to form the isolation regions 200. STI processes are performed to secure the flatness corresponding to the depth of focus (DOF) according to the design rule. During these STI processes, chemical-mechanical polishing (CMP) process is generally used. According to the distribution of substances on the layer polished by the CMP process, some portions of the polished surface become lower than surrounding portions. This phenomenon is referred to as a dishing effect. To solve such a dishing problem, the dummy active regions may be formed in the semiconductor substrate to surround the region of poly resistors. In another way, the dummy active regions may be formed between the poly resistors. Such dummy active regions to prevent or inhibit the dishing problem increase occupation area, and thus, design margin may be decreased.

In the resistor array 1000 according to example embodiments, the dummy active regions, which are formed apart from the unit resistors in conventional art, are placed under the unit resistors 400. Therefore, dishing problem during CMP process can be prevented or reduced without increasing the occupation area.

As will be describe later, a CMP process to the upper surface of the semiconductor substrate 100 may proceed before the unit resistors 400 are formed. The dummy active regions may function as an anti-polishing medium for preventing or reducing a dishing effect on the upper surface of the semiconductor substrate 400 during the CMP process.

A dishing effect on the upper surface of the semiconductor substrate 400 may further degrade the flatness in following CMP processes for forming the metal wire pattern. Since resistance of vertical contacts connecting the metal wire pattern and the resistor has a considerable portion of the total resistance, securing uniform resistance of the vertical contacts is desirable. By preventing or reducing a dishing effect on the upper surface of the semiconductor substrate 400 using the dummy active regions 200, a resistor array having an accurate resistance may be formed.

Figure 3:
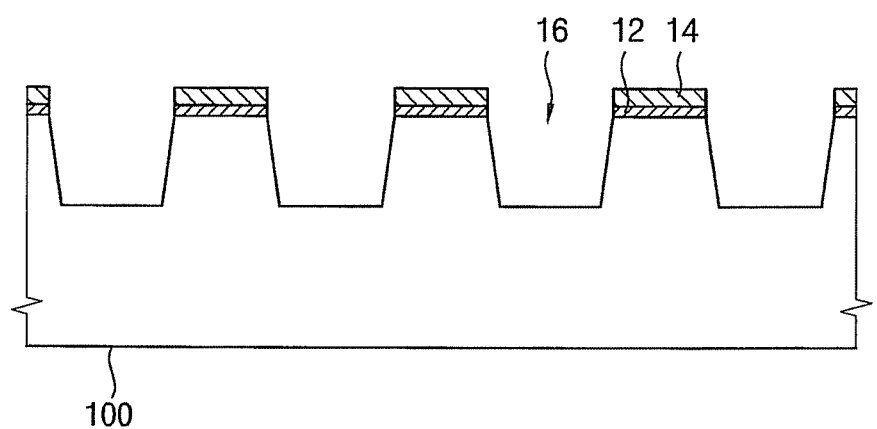
FIGS. 3 to 10 are diagrams illustrating an example of manufacturing process of a resistor array according to example embodiments.

FIGS. 3 to 10 are diagrams illustrating an example of manufacturing process of a resistor array according to example embodiments. Referring to FIG. 3, a pad oxide layer 12 and a hard mask layer 14 is formed in the semiconductor substrate 100. A photo resist film is formed and patterned on the hard mask layer 14, and then a portion of the hard mask layer 14, in which the isolation region will be formed, is exposed. By the patterned photo resist film, the exposed hard mask layer 14 and the pad oxide layer 12 is etched to expose some portion of the semiconductor substrate 100, in which the isolation region will be formed.

The exposed semiconductor substrate 100 is etched to a given depth, e.g., 4,000 to 5,000 Å, to form trenches 16. The isolation regions 200 of FIG. 1 will be formed on the trenches 16 formed in the semiconductor substrate 100.

Figure 4:
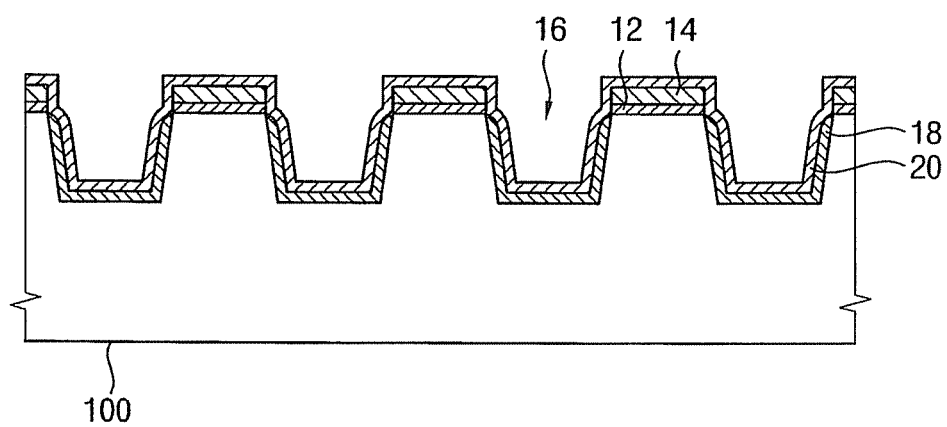

Referring to FIG. 4, a first dielectric layer 18 is formed in the trench 16, and then a second dielectric layer 20 is formed on the first dielectric layer 18. For example, for the first dielectric layer 18, a thermal oxide layer may be formed to a thickness of 10 to 100 Å. Then, for the second dielectric layer 20, a nitride layer may be formed to a thickness of 100 to 200 Å.

Figure 5:
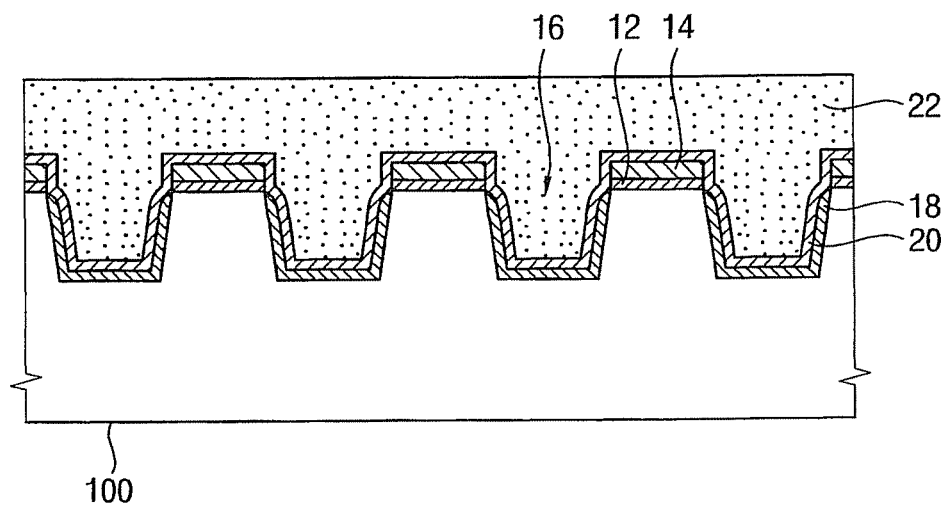

Referring to FIG. 5, a third dielectric layer 22 is formed on the second dielectric layer 20 such that the trenches are filled in. For example, the third dielectric layer 22 may include a high density plasma (HDP) oxide layer and a plasma enhanced tetraethyl orthosilicate (P_TEOS) oxide layer. Before the third dielectric layer 22 is formed, a middle temperature oxide (MTO) layer (not shown) may be further formed on the second dielectric layer 20.

Figure 6:
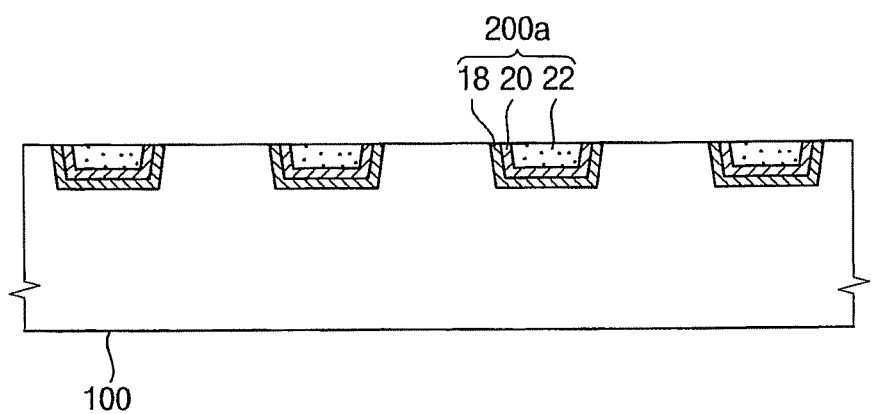

Referring to FIG. 6, for planarization of the second dielectric layer 22, the third dielectric layer 22 is etched by the CMP process until the hard mask pattern 14 is exposed. The hard mask layer 14 and the pad oxide layer 12 are removed to form isolation regions 200*a* including the first dielectric layer (the oxide layer 18), the second dielectric layer (the nitride layer 20) and the isolation layer 22 formed in the trench 16.

Figure 7:
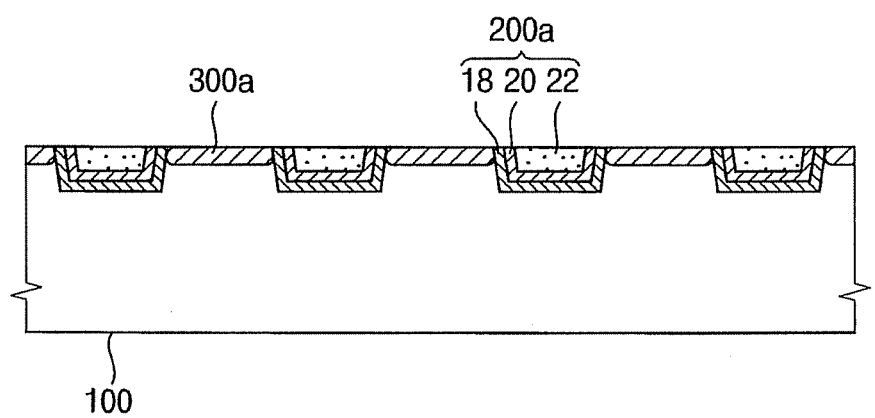

Referring to FIG. 7, dummy active regions 300*a* are formed in the semiconductor substrate 100, in which the isolation regions 200*a* are formed, by performing the ion-implant process. The dummy active regions 200*a* may be doped with N-type or P-type impurities.

When the dummy active regions 300*a* are directly formed in the semiconductor substrate 100, the dummy active regions 300*a* may be doped with impurities having the same conductive type as the semiconductor substrate 100. When the dummy active regions 300 are formed on wells in the semiconductor substrate 100, the dummy active regions 300a may be doped with impurities having the same conductive type to the wells. In other words, when the well is N-type, the dummy active regions 300a may be high concentration N-type impurities regions. When the well is P-type, the dummy active regions 300a may be high concentration P-type impurities regions.

Figure 8:
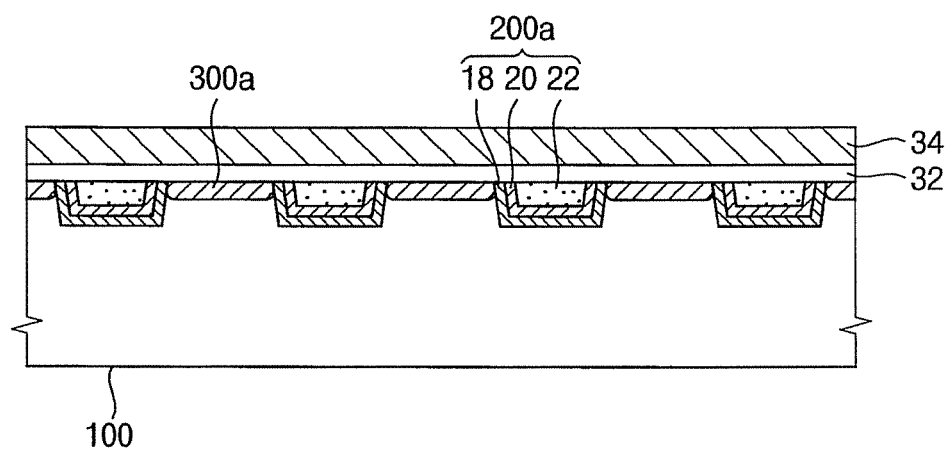

Referring to FIG. 8, a fourth dielectric layer 32 is formed in the semiconductor substrate in which the isolation regions 200a and the dummy active regions 300a are formed. One portion of the fourth dielectric layer may correspond to the gate dielectric layer of the transistor. A polysilicon layer 34 is formed on the fourth dielectric layer 32 to form the unit resistor.

Figure 9:
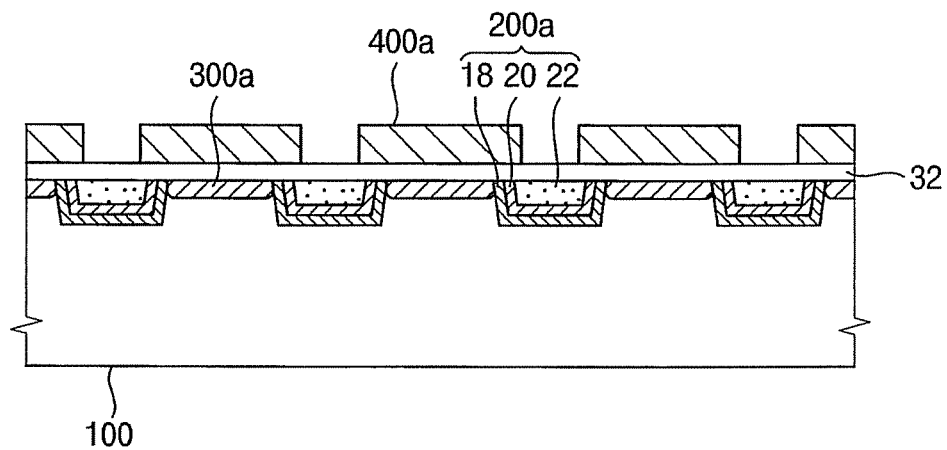

Referring to FIG. 9, the polysilicon layer 34 is patterned to form the plurality of unit resistors 400a on the fourth dielectric layer 32. The polysilicon layer 34 may be formed so that the unit resistors 400a completely cover the dummy active regions 300a. In addition, the polysilicon layer 34 may be formed so that each of the plurality of unit resistors further covers the portion of the isolation region 200a which is adjacent to the dummy active regions 300a, as described above.

Figure 10:
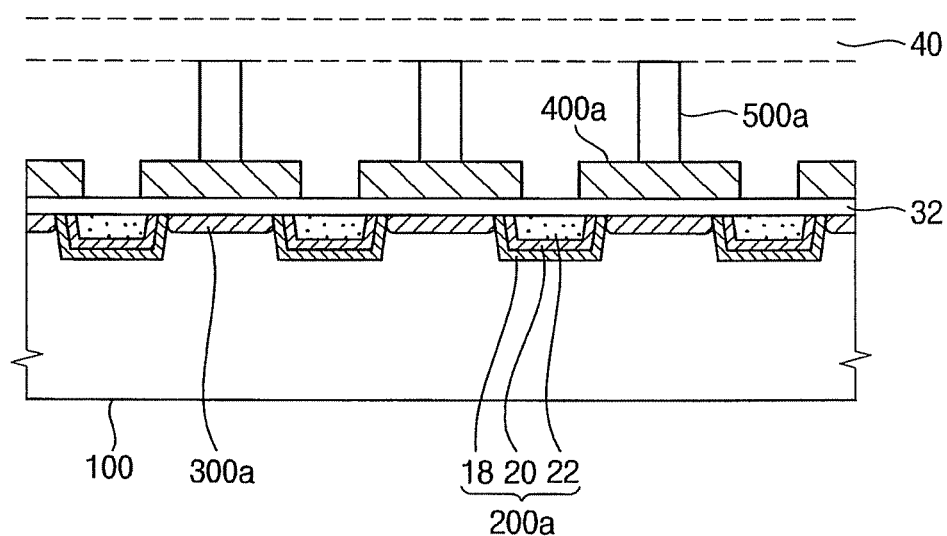

Referring to FIG. 10, vertical contacts 500a are formed above the unit resistors 400a, and the metal wire pattern is formed in a metal wire layer 40. The vertical contacts 500a are for the electric connection between the layers. For example, the vertical contacts 500a may be formed as via contacts.

The metal wire pattern may be formed in various ways based on the connection relationship of the unit resistors 400a. Formation of the metal wire pattern will be described later with reference to the FIGS. 11 to 14.

Figure 11:
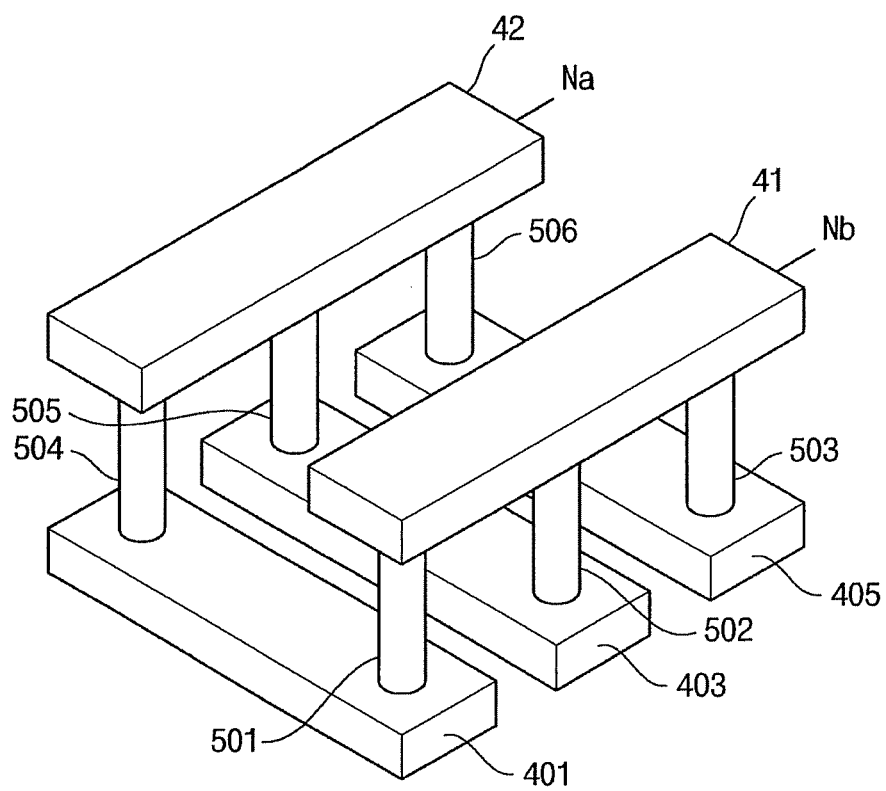
FIGS. 11 and 12 are a perspective view and an equivalent circuit diagram of unit resistors coupled in parallel.
Figure 12:
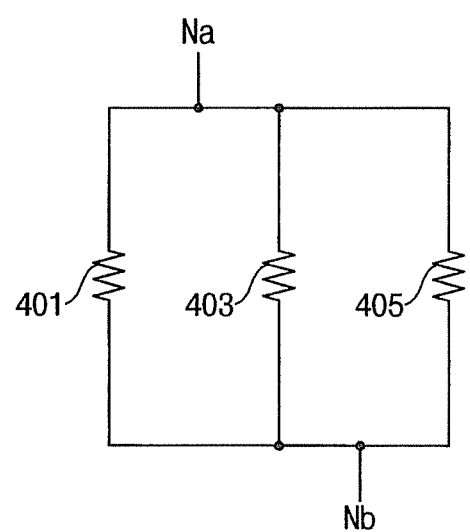

FIGS. 11 and 12 are a perspective view and an equivalent circuit diagram of unit resistors coupled in parallel. Referring to FIGS. 11 and 12, unit resistors 401, 403 and 405 may extend in a first direction, and each of vertical contacts 501, 502, 503, 504, 505 and 506 may be formed at both ends of the first direction of the unit resistors 401, 403 and 405.

Metal wire pattern 41 and 42 connects the unit resistors 401, 403 and 405 in parallel, as illustrated in FIG. 11. As a result, the combined resistance between a first node Na and a second node Nb is smaller than each of the unit resistors 401, 403 and 405 by connecting the unit resistors 401, 403 and 405 in parallel.

Although an example embodiment connecting three unit resistors 401, 403 and 405 in parallel is illustrated in FIGS. 11 and 12, a smaller combined resistance may be obtained by connecting more unit resistors in parallel.

Figure 13:
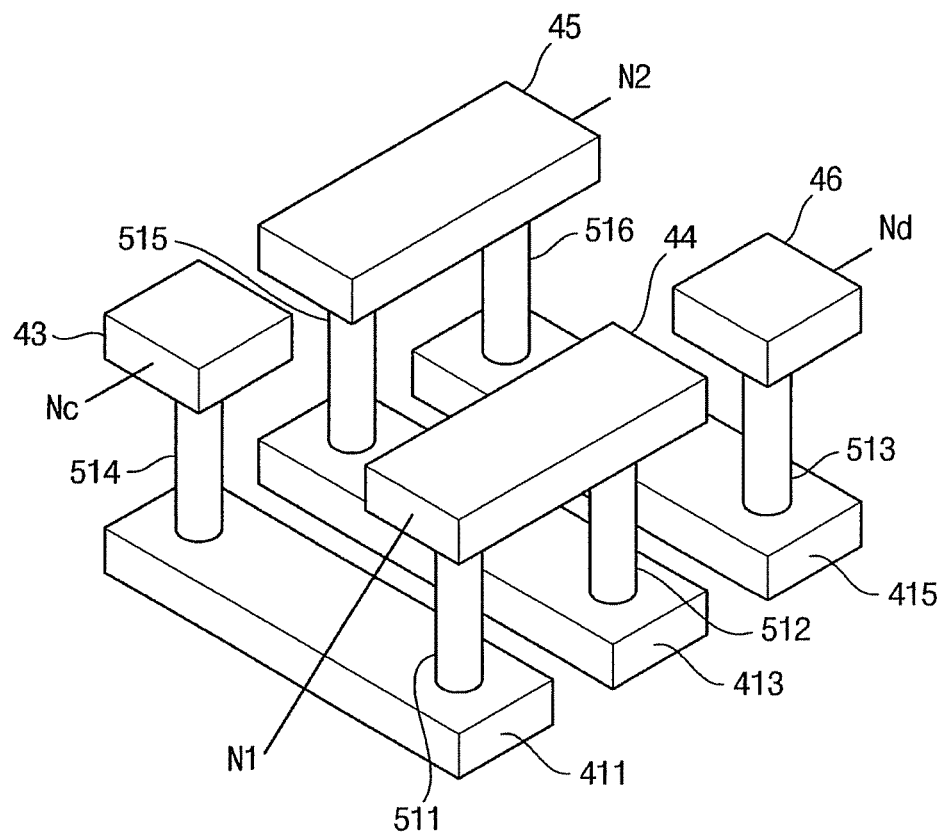
FIGS. 13 and 14 are a perspective view and an equivalent circuit diagram of unit resistors coupled in series.
Figure 14:
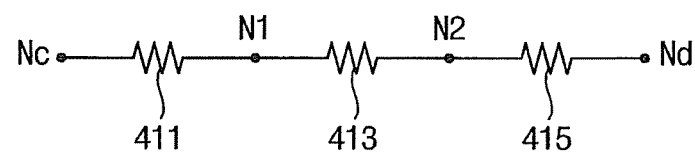

FIGS. 13 and 14 are a perspective view and an equivalent circuit diagram of unit resistors coupled in series. Referring to FIGS. 13 and 14, unit resistors 411, 413 and 415 may extend in a first direction, and each of vertical contacts 511, 512, 513, 514, 515 and 516 may be formed at both ends of the first direction of the unit resistors 411, 413 and 415.

Metal wire pattern 43, 44, 45 and 46 connects the unit resistors 411, 413 and 415 in series, as illustrated in FIG. 13. As a result, the combined resistance between a third node Nc and a fourth node Nd is larger than each of the unit resistors 411, 413, 415 by connecting the unit resistors 411, 413, 415 in series.

Although an example embodiment connecting three unit resistors 411, 413, 415 in series is illustrated in FIGS. 13 and 14, a larger combined resistance may be obtained by connecting more unit resistors in series.

In this series connection, a voltage between a fifth node N1 and a sixth node N2 correspond to a divided voltage from a voltage between the third node N3 and the fourth node N4. In other words, the unit resistors 411, 413 and 415 may be used as a voltage divider, and the metal wire pattern 44 and 45, which respectively correspond to the fifth node N1 and the sixth node N2, may be used for output of voltage division.

Figure 15:
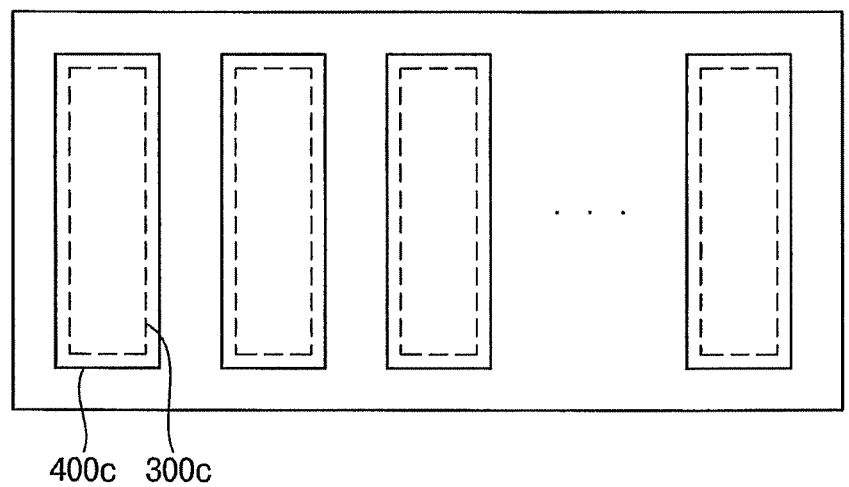
FIGS. 15 and 16 are diagrams illustrating examples of dummy active regions in a resistor array according to example embodiments.
Figure 16:
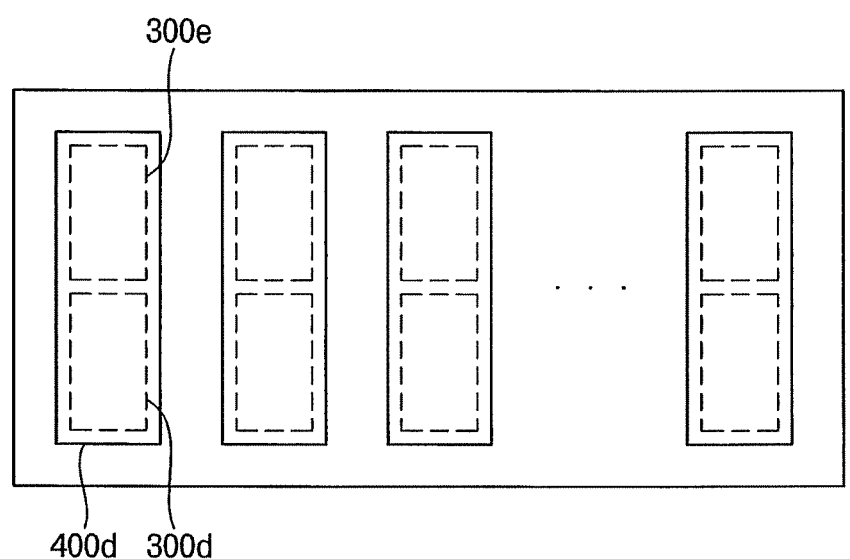

FIGS. 15 and 16 are diagrams illustrating examples of dummy active regions in a resistor array according to example embodiments. Referring to FIG. 15, a resistor array 1000b may be formed so that one dummy active region 300c is formed under each of the unit resistors 400c. In addition, as illustrated in FIG. 16, two or more dummy active regions 300d and 300e, which are separated from each other, may be formed under each of the unit resistors 400d in the resistor array 1000c.

The number of the dummy active regions formed under each of the unit resistors may be determined considering various factors, e.g., density of the dummy active region for protection from a dishing effect in a CMP process, overall design margin, and size of the unit resistors.

Although an example embodiment may include vertical contacts 500 formed at both ends of the unit resistors 400, the formation position and the number of the vertical contacts may be changed variously.

Figure 17:
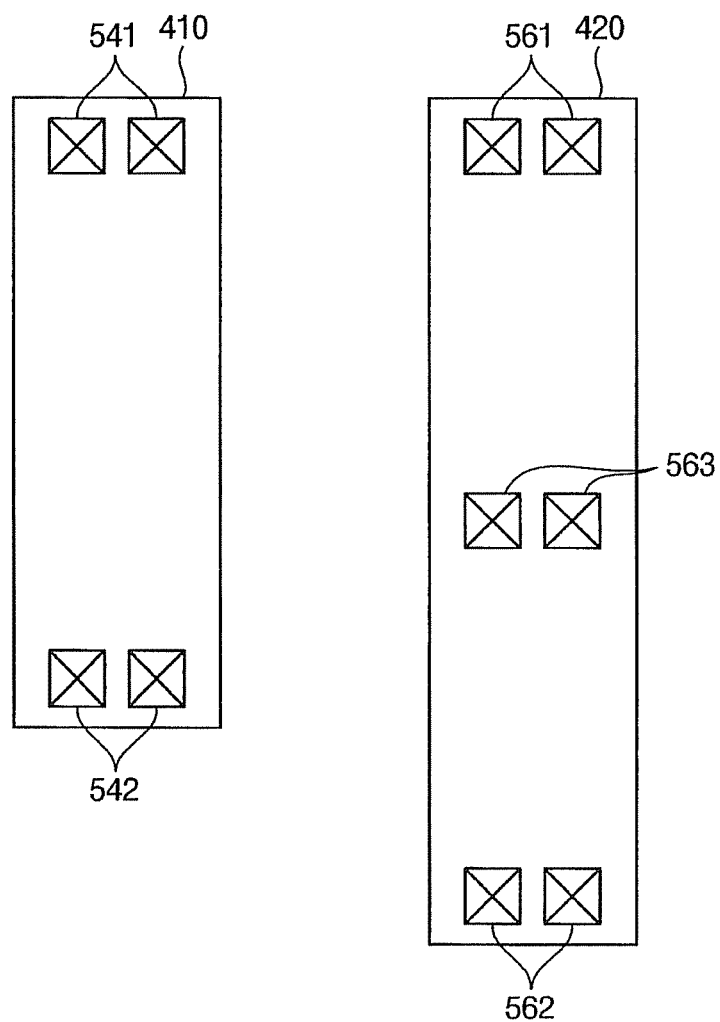
FIG. 17 is a diagram illustrating an example of vertical contacts formed on a resistor.

FIG. 17 is a diagram illustrating an example of vertical contacts formed on a resistor. For example, as illustrated in FIG. 17, a pair of vertical contacts 541 and 542, and 561 and 562 may be formed in both ends of each of the unit resistors 410 and 420, respectively. In addition, when the unit resistor 420 is longer than the unit resistor 410 as illustrated in FIG. 17, a vertical contact 563 may be formed in the middle of the unit resistor.

When the vertical contact is formed in the middle of the unit resistor, voltage division may be performed using one unit resistor 420 without the metal wire pattern, and a divided voltage may be output through the vertical contact 563.

Figure 18:
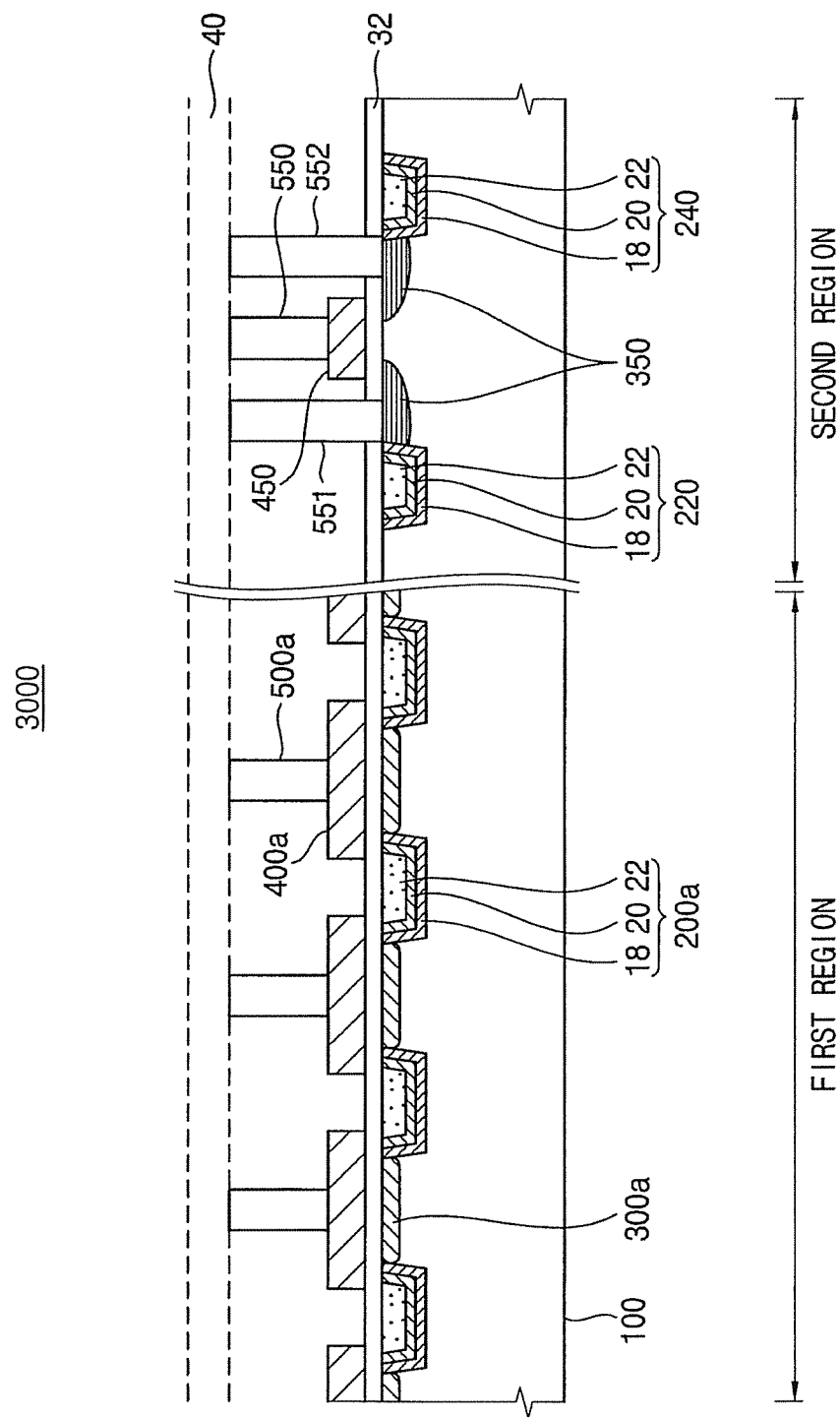
FIG. 18 is a diagram illustrating a semiconductor device according to example embodiments.

FIG. 18 is a diagram illustrating a semiconductor device according to example embodiments. Referring to FIG. 18, the semiconductor device 3000 may be integrated using the semiconductor substrate 100. The semiconductor substrate 100 may include a first region, in which a resistor array is formed, and a second region, in which other various elements such as transistors are formed.

A plurality of isolation regions 200a are formed in the first region of the semiconductor substrate 100, and a plurality of dummy active regions 300a are formed between the isolation regions 200a in the first region.

As described above, the dummy active regions 300a may be doped with N-type impurities or P-type impurities. In addition, the dummy active regions 300a may be floated without applying a bias-voltage.

A plurality of unit resistors 400a may be formed on the dummy active regions. As described above, the resistor array may be formed in the first region such that the unit resistors 400a completely cover the dummy active regions 300a.

Since the resistor array formed in the first region of the semiconductor substrate 100 was already described with reference to FIGS. 1 to 17, the relationship between a transistor in the second region and the resistor array will be described below. Details regarding the semiconductor device 3000 described previously may be omitted.

The transistor formed in the second region of the semiconductor substrate 100 may be positioned in an active region between two isolation regions 220, 240. The fourth insulating later 32, which was described above in the manufacturing process of the resistor array, may correspond to the gate insulating later. In addition, the polysilicon patterned on the gate dielectric layer may correspond to the gate 450 of the transistor. Vertical contacts 550, 551 and 552 formed on a junction region 350 may be used as conductive paths transmitting electrode voltage of the transistor.

The isolation regions 200a of the first region and the isolation regions 220, 240 of the second region may be formed by the same process. The isolation regions of the first region and the second region may be equal to each other in size. Alternatively, sizes of the isolation regions of the first region and the second region may be different from each other.

In addition, the unit resistors 400a of the first region and the gate 450 of the second region may be formed by the same process. The vertical contacts 500a and 550 of the first region and the second region may be formed by the same process.

The dummy active regions 300a formed in the first region may be completely doped with N-type impurities or P-type impurities. The junction or active region 350 of the transistor formed in the second region may be partially doped with N-type impurities or P-type impurities to form a source/drain.

In other words, the dummy active regions 300a of the first region may be doped before the unit resistors 400a and the gate 450 is formed, and the active region of the transistor may be doped after the unit resistors 400a and the gate 450 is formed. To achieve this, the second region may be masked during the ion-implantation process of the first region, and the first region may be masked during the ion-implantation process of the second region.

Productivity of the semiconductor device 3000 may be increased by sharing most of the processes for forming the resistor array and other elements in the same semiconductor substrate 100.

Figure 19:
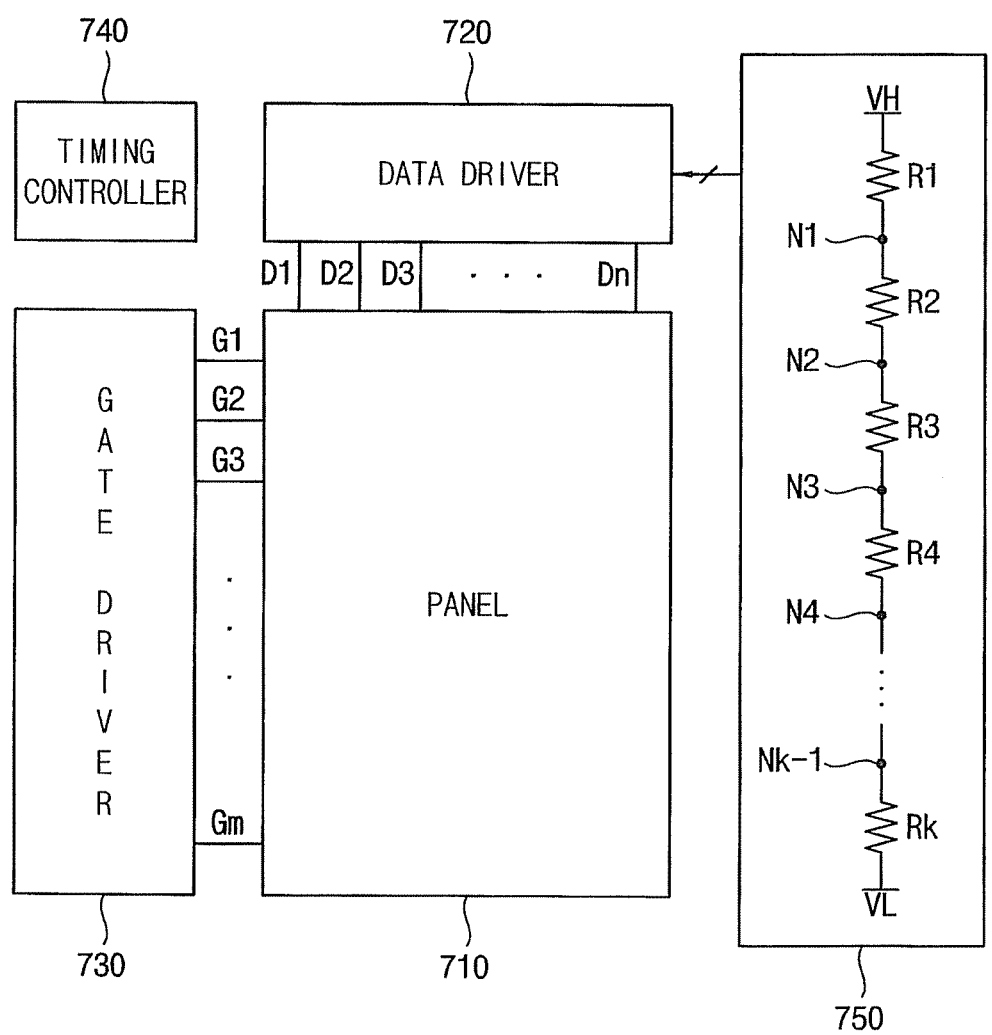
FIG. 19 is a block diagram illustrating a display apparatus including a resistor array according to example embodiments.

FIG. 19 is a block diagram illustrating a display apparatus including a resistor array according to example embodiments. Referring to FIG. 19, a display device 3000a may include a display panel 710 and display driver integrated circuit (DDI). The display driver integrated circuit may include a timing controller 740, a gate driver 730, a data driver 720 and a gray-scale voltage generator 750.

The display panel 710 may include a plurality of gate lines G1~Gm and a plurality of data lines D1~Dn. In addition, each pixel may be defined as corresponding to a region in which each of the gate lines and each of the data lines intersect. The gate driver 730 may enable a particular gate line of the display panel 710 to select a row of the pixel array. In addition, the data driver 720 may apply a voltage signal to data line D1~Dn for displaying an image. The voltage signal applied to the data line D1~Dn may be based on the gray-scale voltages provided by the gray-scale voltage generator 750.

The gray-scale voltage generator 750 (i.e., gamma generator) may include a plurality of resistors R1~Rk connected in series between a first voltage VH and a second voltage VL to provide the plurality of gray-scale voltages (i.e., gamma voltages). The gray-scale generator 750 may provide the gray-scale voltages, which are generated by dividing the first voltage VH and the second voltage VL with the resistors R1~Rk, at nodes N1~Nk−1.

When the deviation of resistance distribution of the resistors R1~Rk is larger, the accuracy of the gray-scale voltages is decreased, thereby resulting in a diminished quality of the image output by the display panel 710. In addition, the resistors included in the semiconductor integrated circuit generally occupy a relatively large area. Therefore, a device needing many resistors, such as a gray-scale voltage generator 750 in FIG. 19, may be a major cause of larger chip size.

The resistor array according to example embodiments may be included in the display driver integrated circuit. In other words, some of the unit resistors described with reference to the FIGS. 1 to 18 may be used as voltage dividing resistors for providing the gray-scale voltages in the display driver integrated circuit.

As described above, by applying the resistor array according to example embodiments to the semiconductor device such as the display driver integrated circuit, the manufacturing process may be simplified and the chip size may be decreased. In addition, a dishing effect in a CMP process may be prevented or reduced, and accurate resistance can be obtained. As a result, performance of the semiconductor device may be enhanced.

The resistor array according to example embodiments may be used in devices and systems, which require a plurality of resistors in the integrated circuit. In addition, the resistor array according to example embodiments may be used in devices and systems requiring many resistors and accurate resistances.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A resistor array comprising:
    a plurality of isolation regions formed in a semiconductor substrate;
    a plurality of dummy active regions formed in the semiconductor substrate between the plurality of isolation regions; and
    a plurality of unit resistors formed on the plurality of dummy active regions,
    wherein the plurality of dummy active regions are doped with N-type impurities or P-type impurities.

2. The resistor array of claim 1, wherein the plurality of unit resistors completely cover the plurality of dummy active regions.

3. The resistor array of claim 2, wherein the plurality of unit resistors further cover portions of the plurality of isolation regions adjacent to the plurality of dummy active regions.

4. The resistor array of claim 1, wherein the plurality of dummy active regions are floating regions without a bias-voltage being applied thereto.

5. The resistor array of claim 1, wherein each of the plurality of unit resistors is formed of polysilicon and extends in a first direction, and the plurality of unit resistors are arranged in a second direction perpendicular to the first direction.

6. The resistor array of claim 5, wherein the plurality of unit resistors are doped with N-type impurities or P-type impurities.

7. The resistor array of claim 5, further comprising:
    at least one metal wire pattern formed on the plurality of unit resistors; and
    a plurality of vertical contacts electrically connecting the at least one metal wire pattern with both ends of each of the plurality of unit resistors extending in the first direction.

8. The resistor array of claim 5, further comprising:
at least one dielectric layer formed on the semiconductor substrate, the dielectric layer isolating the plurality of unit resistors from the semiconductor substrate.

9. The resistor array of claim 1, wherein one dummy active region of the plurality of dummy active regions is formed under a corresponding unit resistor of the plurality of unit resistors.

10. The resistor array of claim 1, wherein at least two dummy active regions of the plurality of dummy active regions are formed under a corresponding unit resistor of the plurality of unit resistors, the at least two dummy active regions of the plurality of dummy active regions being separated from each other.

11. The resistor array of claim 1, wherein an upper surface of the semiconductor substrate is planarized by a chemical-mechanical polishing (CMP) process before the plurality of unit resistors are formed, and the plurality of dummy active regions are configured to function as an anti-polishing medium.

12. The resistor array of claim 1, wherein a first distance between a lower surface of one of the plurality of unit resistors and an upper surface of a corresponding one of the plurality of dummy active regions is substantially equal to a second distance between the lower surface of the one of the plurality of unit resistors and an upper surface of one of the plurality of isolation regions that is adjacent to the corresponding one of the plurality of dummy active regions.

13. A semiconductor device comprising:
a plurality of isolation regions formed in a first region of a semiconductor substrate;
a plurality of dummy active regions formed in the first region of the semiconductor substrate between the plurality of isolation regions,
the plurality of dummy active regions having upper surfaces that are at a substantially equal height to a height of upper surfaces of the plurality of isolation regions;
a plurality of unit resistors formed on the plurality of dummy active regions; and
at least one transistor formed on a second region of the semiconductor substrate.

14. The semiconductor device of claim 13, further comprising:
at least one metal wire pattern formed on the plurality of unit resistors; and
a plurality of vertical contacts electrically connecting the at least one metal wire pattern with both ends of each of the plurality of unit resistors extending in the first direction.

15. The semiconductor device of claim 13, further comprising:
at least one dielectric layer formed on the semiconductor substrate, the dielectric layer isolating the plurality of unit resistors from the semiconductor substrate.

16. The semiconductor device of claim 13, wherein a first distance between a lower surface of one of the plurality of unit resistors and an upper surface of a corresponding one of the plurality of dummy active regions is substantially equal to a second distance between the lower surface of the one of the plurality of unit resistors and an upper surface of one of the plurality of isolation regions that is adjacent to the corresponding one of the plurality of dummy active regions.

17. A resistor array comprising:
a plurality of anti-polishing structures formed in a semiconductor substrate; and
a plurality of unit resistors formed to cover the plurality of anti-polishing structures,
wherein the plurality of anti-polishing structures are doped with N-type impurities or P-type impurities.

18. The resistor array of claim 17, further comprising:
a plurality of separating structures formed in the semiconductor substrate, the plurality of anti-polishing structures separating the plurality of separating structures.

19. The resistor array of claim 18, wherein the plurality of unit resistors further cover portions of the plurality of separating structures adjacent to the plurality of anti-polishing structures.

20. The resistor array of claim 17, wherein the plurality of anti-polishing structures are a plurality of dummy active regions.

21. The resistor array of claim 17, further comprising:
at least one metal wire pattern formed on the plurality of unit resistors; and
a plurality of vertical contacts electrically connecting the at least one metal wire pattern with both ends of each of the plurality of unit resistors extending in the first direction.

22. The resistor array of claim 17, further comprising:
a plurality of isolation regions formed in the semiconductor substrate between the plurality of anti-polishing structures, wherein
upper surfaces of the plurality of isolations and upper surfaces of the plurality of anti-polishing structures are at substantially equal heights.

* * * * *